(12) United States Patent
Hong et al.

(10) Patent No.: US 12,152,187 B2
(45) Date of Patent: Nov. 26, 2024

(54) NITRIDE ETCHANT COMPOSITION AND METHOD

(71) Applicant: ENTEGRIS, INC., Billerica, MA (US)

(72) Inventors: Eric Hong, Bundang (KR); SeongJin Hong, Cheongju (KR); WonLae Kim, Gunpo (KR); JeongYeol Yang, Gunpo (KR); SeungHyun Chae, Gunpo (KR); JuHee Yeo, Suwon (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/402,126

(22) Filed: Aug. 13, 2021

(65) Prior Publication Data

US 2022/0049160 A1 Feb. 17, 2022

Related U.S. Application Data

(60) Provisional application No. 63/065,035, filed on Aug. 13, 2020.

(51) Int. Cl.
*C09K 13/08* (2006.01)
*H01L 21/306* (2006.01)

(52) U.S. Cl.
CPC ........ *C09K 13/08* (2013.01); *H01L 21/30604* (2013.01)

(58) Field of Classification Search
None
See application file for complete search history.

(56) References Cited

U.S. PATENT DOCUMENTS

| 9,771,550 B2* | 9/2017 | Kneer ................. C11D 11/0047 |
| 10,138,117 B2 | 11/2018 | Chen | |
| 10,508,344 B1* | 12/2019 | Rananavare ............. C23F 1/26 |
| 2009/0163396 A1* | 6/2009 | Hsu ..................... C11D 11/0047 |
| | | | 510/176 |
| 2014/0038420 A1* | 2/2014 | Chen .............. H01L 21/823842 |
| | | | 438/754 |
| 2015/0027978 A1* | 1/2015 | Barnes ............. H01L 21/32134 |
| | | | 252/79.3 |
| 2015/0048053 A1 | 2/2015 | Cordonier et al. |
| 2015/0075570 A1* | 3/2015 | Wu ..................... C11D 11/0047 |
| | | | 134/41 |
| 2016/0032186 A1* | 2/2016 | Chen ....................... C09K 13/00 |
| | | | 252/79.3 |
| 2016/0130500 A1* | 5/2016 | Chen .................... C11D 3/3947 |
| | | | 216/13 |
| 2016/0185595 A1* | 6/2016 | Chen ....................... C09K 13/10 |
| | | | 252/79.3 |
| 2017/0200601 A1* | 7/2017 | Song ........................ C11D 7/28 |

(Continued)

FOREIGN PATENT DOCUMENTS

EP          2964725 A1 *  1/2016  ............. C09K 13/00
JP        2001140084 A      5/2001
(Continued)

*Primary Examiner* — Allan W. Olsen (57) ABSTRACT

Provided are compositions and methods for selectively etching titanium nitride, generally leaving molybdenum present unaffected by the process, as well as any aluminum oxide, silicon dioxide, and polysilicon which may be present on the device. In general, the compositions of the invention were able to achieve titanium nitride etch rates exceeding 3.5 Å/minute, thereby providing uniform recess top and bottom layers in patterns.

5 Claims, 1 Drawing Sheet

(56) References Cited

U.S. PATENT DOCUMENTS

| | | | |
|---|---|---|---|
| 2017/0260449 A1* | 9/2017 | Barnes | C09K 13/10 |
| 2018/0130706 A1* | 5/2018 | Chen | C23C 16/18 |
| 2018/0148669 A1* | 5/2018 | Payne | C11D 3/06 |
| 2019/0088492 A1* | 3/2019 | Liu | C09K 13/08 |
| 2019/0103282 A1 | 4/2019 | Ge et al. | |
| 2020/0013633 A1* | 1/2020 | Wang | H01L 21/31122 |
| 2020/0027740 A1 | 1/2020 | Vervuurt et al. | |
| 2020/0071642 A1* | 3/2020 | Thomas | C11D 3/3765 |
| 2020/0255770 A1* | 8/2020 | Das | C11D 7/36 |
| 2021/0179972 A1* | 6/2021 | Champion | C11D 7/26 |
| 2022/0033710 A1* | 2/2022 | Bilodeau | H01L 21/31105 |

FOREIGN PATENT DOCUMENTS

| | | | |
|---|---|---|---|
| WO | 2015111684 A1 | 7/2015 | |
| WO | WO-2016042408 A2 * | 3/2016 | H01L 21/02063 |
| WO | 2020131208 A1 | 6/2020 | |

\* cited by examiner

NITRIDE ETCHANT COMPOSITION AND METHOD

FIELD OF THE INVENTION

The invention relates in general to the field of semiconductor manufacturing. In particular, it relates to a method for the etching of titanium nitride films on microelectronic devices.

BACKGROUND OF THE INVENTION

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material, or other materials on the microelectronic device. In particular, there is a need for compositions which can be utilized in a wet-etching process which are selective in removing substances such as titanium nitride, while being compatible with metal conducting layers such as molybdenum, AlOx, SiOx, and polysilicon which may also be present on the microelectronic device.

SUMMARY OF THE INVENTION

The invention generally provides compositions and methodology for creating molybdenum recesses within microelectronic device structures, for example 3D NAND flash memory devices. In this methodology, a first step involves removal of a molybdenum layer using a highly selective molybdenum etchant, which exhibits selectivity of molybdenum over titanium nitride also present on the microelectronic device. This first step is known and can be characterized as a dry or wet etching process (See, for example IEEE Transactions on Electronic Devices, Vol. 51, No. 12, December 2004). In a second step, in one embodiment of the invention, the titanium nitride layer is selectively etched, generally leaving the molybdenum present unaffected by the process, as well as any aluminum oxide, silicon dioxide, and polysilicon which may be present on the device. In general, the compositions of the invention were able to achieve titanium nitride etch rates exceeding 3.5 Å/minute, thereby providing uniform recess top and bottom layers in patterns. Additionally, the compositions are quite stable, for example greater than 24 hours of bath life and greater than 6 months shelf life.

Thus, in a first aspect, the invention provides composition comprising:
a. water;
b. at least one oxidizing agent;
c. at least one fluoride containing etchant;
d. at least one metal corrosion inhibitor;
e. at least one pH adjustor; and optionally
f. at least one water-miscible solvent.

Such compositions are useful in the selective etching of titanium nitride. The selectivity of the compositions depends on process temperature and time (i.e., exposure). In one embodiment, the selectivity of titanium nitride etching versus molybdenum is about 5 to 25, when measured at about 50° C. for 5 minutes.

BRIEF DESCRIPTION OF THE DRAWINGS

FIG. 1 is a flow diagram of the process of the invention. Starting with a device structure possessing gate materials comprising tungsten and molybdenum, the device structure is subjected to, for example, dry etching (or wet etching) techniques to provide a gate metal recess. Subsequently, the barrier metals, for example titanium nitride and/or tantalum nitride are then etched. This selectivity for removing titanium nitride and tantalum nitride is compatible with existing gate materials such as tungsten or molybdenum and high k materials such as AlOx or ZrOx.

DETAILED DESCRIPTION OF THE INVENTION

Figure 1:
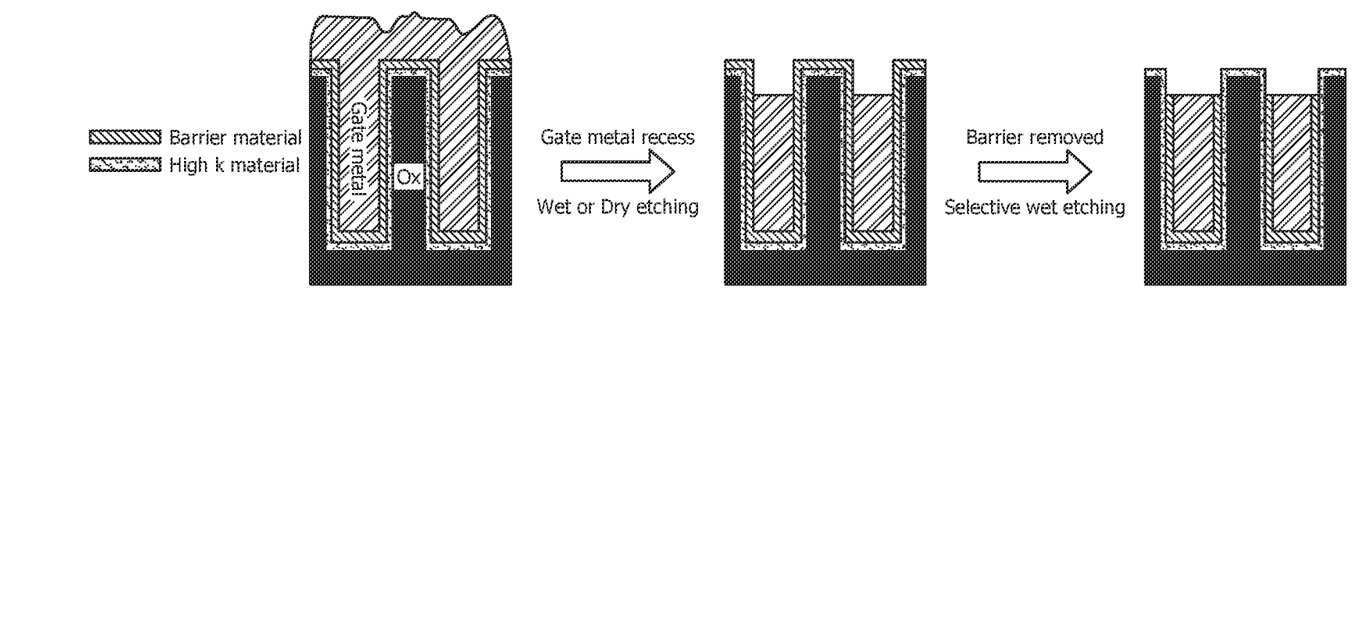

In a first aspect, the invention provides a composition comprising:
a. water;
b. at least one oxidizing agent;
c. at least one fluoride containing etchant;
d. at least one metal corrosion inhibitor;
e. at least one pH adjustor; and optionally
f. at least one water-miscible solvent.

As used herein, the term "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As used herein, the terms "titanium nitride" and "TiN$_x$" correspond to pure titanium nitride as well as impure titanium nitride including varying stoichiometries, and oxygen content (i.e., TiO$_x$N$_y$).

As used herein, "about" is intended to correspond to + or −0.5% of the stated value.

As used herein, the term "low-k dielectric material" corresponds to any material used as a dielectric material in a layered microelectronic device, wherein the material has a dielectric constant less than about 3.5. In certain embodiments, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, aluminum oxides ($AIO_x$), zirconium oxides ($ZrO_x$), and carbon-doped oxide (CDO) glass. It should also be appreciated that the low-k dielectric materials may have varying densities and varying porosities.

As used herein, the term "metal conductor layers" comprise copper, tungsten, cobalt, molybdenum, aluminum, ruthenium, alloys comprising same, and combinations thereof.

As used herein, "fluoride" species correspond to species including an ionic fluoride ($F^-$) or covalently bonded fluorine. It is to be appreciated that the fluoride species may be included as fluoride species or generated in situ.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 weight percent, based on the total weight of the composition in which such components are employed.

Etchants are added to increase the etch rate of the titanium nitride. Etchants contemplated include, but are not limited to, fluoride sources such as HF, ammonium fluoride, tetrafluoroboric acid, hexafluorosilicic acid, other compounds containing B—F or Si—F bonds, tetrabutylammonium tetrafluoroborate ($TBA-BF_4$), tetraalkylammonium fluoride ($NR_1R_2R_3R_4F$), strong bases such as tetraalkylammonium hydroxide ($NR_1R_2R_3R_4OH$), where $R_1$, $R_2$, $R_3$, $R_4$ may be the same as or different from one another and are chosen from hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl), weak bases, and combinations thereof. In one embodiment, the fluoride source comprises HF, tetrafluoroboric acid, hexafluorosilicic acid, $H_2ZrF_6$, $H_2TiF_6$, $HPF_6$, ammonium fluoride, tetramethylammonium fluoride, tetramethylammonium hydroxide, ammonium hexafluorosilicate, ammonium hexafluorotitanate, or a combination of ammonium fluoride and tetramethylammonium fluoride. In another embodiment, the etchant comprises HF, hexafluorosilicic acid or tetrafluoroboric acid. In yet another embodiment, the etchant is HF.

Oxidizing agents are included to etch or oxidize $Ti^{3+}$ in $TiN_x$ films. Oxidizing agents contemplated herein include, but are not limited to, hydrogen peroxide ($H_2O_2$), $FeCl_3$, $FeF_3$, $Fe(NO_3)_3$, $Sr(NO_3)_2$, $CoF_3$, $MnF_3$, Oxone® ($2KHSO_5 \cdot KHSO_4 \cdot K_2SO_4$—CAS No. 70693-62-8), periodic acid, iodic acid, t-butyl hydroperoxide, vanadium (V) oxide, vanadium (IV,V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$)), ammonium tungstate (($NH_4)_{10}H_2(W_2O_7)$)), sodium polyatomic salts (e.g., sodium persulfate ($Na_2S_2O_8$), sodium hypochlorite (NaClO), sodium perborate), potassium polyatomic salts (e.g., potassium iodate ($KIO_3$), potassium permanganate ($KMnO_4$), potassium persulfate, nitric acid ($HNO_3$), potassium persulfate ($K_2S_2O_8$), potassium hypochlorite (KClO)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)_{IO3}$), tetramethylammonium perborate (($N(CH_3)_4)BO_3$), tetramethylammonium perchlorate (($N(CH_3)_4)ClO_4$), tetramethylammonium periodate (($N(CH_3)_4)_{IO4}$), tetramethylammonium persulfate (($N(CH_3)_4)S_2O_8$)), tetrabutylammonium polyatomic salts (e.g., tetrabutylammonium peroxomonosulfate), peroxomonosulfuric acid, ferric nitrate ($Fe(NO_3)_3$), urea hydrogen peroxide (($CO(NH_2)_2)H_2O_2$), peracetic acid ($CH_3(CO)OOH$), 1,4-benzoquinone, toluquinone, dimethyl-1,4-benzoquinone, chloranil, alloxan, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. In one embodiment, the oxidizing agent comprises periodic acid.

Metal corrosion inhibitors are added to block the oxidative activity of the oxidizing agent(s). Metal corrosion inhibitors contemplated herein include, but are not limited to, 5-amino-1,3,4-thiadiazole-2-thiol (ATDT), benzotriazole (BTA), 1,2,4-triazole (TAZ), tolyltriazole, 5-methyl-benzotriazole (MBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, indiazole, adenosine, carbazole, saccharin, benzoin oxime, and combinations thereof. Additional corrosion inhibitors include cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride (DTAC), ethylhexadecyldimethylammonium bromide, dodecyl(2-hydroxyethyl)dimethyl ammonium bromide, hexadecyl(2-hydroxyethyl)dimethyl ammonium chloride, cetyltrimethylammonium p-toluenesulfonate, dodecylpyridium (laurylpyridinium) chloride, dodecyltrimethylammonium methanesulfonate, dodecyltrimethylammonium p-toluenesulfonate, [9-(2-carboxyphenyl)-6-diethylamino-3-xanthenylidene]-diethylammonium chloride (Rhodamine B)

Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis (decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), PEG-PPG copolymers such as Pluronic F-127 (BASF), anionic surfactants such as dodecylbenzenesulfonic acid, sodium dodecyl sulfate, sodium dodecylbenzenesulfonate, and combinations thereof. The quaternary salts can function as both corrosion inhibitors (especially for copper and tungsten) and wetting agents. Preferred tungsten corrosion inhibitors include Tomamine® ether amines including, but not limited to ether quaternary amines (e.g., the Q-series such as isodecyloxypropyl bis-(2-hydroxyethyl) methyl ammonium chloride, isotridecyloxypropyl bis-(2-hydroxyethyl) methyl ammonium chloride, mono soya methyl ammonium chloride, tallow diamine diquaternary, coco poly(15) oxyethylene methyl ammonium chloride), ether amine oxides (e.g., the AO series such as bis-(2-hydroxyethyl) isodecyloxypropylamine oxide, linear alkyloxypropylamine oxide, low-foam alkyloxypropylamine oxide (AO-405 and AO-455), and combinations thereof. Other amine oxide surfactants will also be useful tungsten corrosion inhibitors including, but not limited to, dodecyldimethylamine oxide, bis-(2-hydroxyethyl)-Cocoalkylamine Oxide (Aromox® C/12 W, Azko Nobel), dimethylcocoalkylamine oxide (Aromox® DMC), 4-(benzyloxy)pyridine N-oxide, 4-(3-phenylpropyl) pyridine N-oxide, and combinations thereof. Other useful tungsten corrosion inhibitors include heterocycles such as pyridine, quinoline, quinazoline, isoquinoline, pyrazine, pyrimidine, pyridazine, quinoxaline, phenazine, phenanthridine, 2,2'-pyridine, 1,4'-pyridine, 4,4'-pyridine, and acridine, as well as derivatives of the heterocycles including at least one of $C_1$-6 alkyls, phenyl, benzyl, phenethyl, 3-phenylpropyl, benzyloxy, carboxyl, chloro, bromo, methoxy, nitro, and cyano groups, including, but not limited to, 2-benzylpyridine, and 4-(4-nitrobenzyl)pyridine, It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such converted quaternary salts are also contemplated and preferred herein. In one embodiment, corrosion inhibitors include the cationic quaternary salts, more preferably myristyltrimethylammonium bromide, benzalkonium chloride, hexadecyltrimethylammonium p-toluenesulfonate, DTAC, and hexadecyltrimethylammonium hydroxide, wherein the chlorides have been ion exchanged prior to use.

In one embodiment, the corrosion inhibitor is chosen from benzyldimethyldodecylammonium chloride, benzyldimethyltetradecylammonium chloride, 4-(3-phenylpropyl)pyridine, and 5-methyl-benzotriazole.

The compositions of the invention can comprise one or more compounds capable of adjusting (i.e., that adjust) the pH of the composition (i.e., pH adjustors). The pH of the compositions can be adjusted using any suitable compound capable of adjusting the pH of the composition. The pH adjustor desirably is water-soluble and compatible with the other components of the composition. Typically, the composition has a pH of about −1 to 5, or 0-4, or 2 to 4 at the point-of-use. Non-limiting examples of pH adjustors include mineral acids and organic acids, including methane sulfonic acid, ethane sulfonic acid phosphoric acid, sulfuric acid, hydrogen chloride, and the like.

The at least one solvent can comprise water, at least one water-miscible organic solvent, or a combination thereof, wherein the at least one water-miscible organic solvent is selected from the group consisting of a compound of formula $R^1R^2R^3C(OH)$, where $R^1$, $R^2$ and $R^3$ are independent from each other and are selected from to the group consisting of hydrogen, $C_2$-$C_{30}$ alkyls, $C_2$-$C_{30}$ alkenes, cycloalkyls, $C_2$-$C_{30}$ alkoxys, and combinations thereof. For example, the at least one solvent can comprise at least one species selected from the group consisting of water, methanol, ethanol, isopropanol, butanol, and higher alcohols, tetrahydrofurfuryl alcohol (THFA), 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran (THF), N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, 1,4-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof. In one embodiment, the at least one solvent comprises water, for example, deionized water. In one embodiment, the water-miscible solvent is chosen from ethylene glycol and propylene glycol.

Optionally, the compositions can comprise at least one complexing/chelating agent. Such complexing agents are however necessary components of the composition when the oxidizing agent is a peroxide compound such as hydrogen peroxide. Complexing agents, when present, are added to reduce particle generation and growth and to improve shelf life of the composition. Complexing agents contemplated include, but are not limited to, β-diketonate compounds such as 2,4-pentanedione, acetylacetonate, 1,1,1-trifluoro-2,4-pentanedione, and 1,1,1,5,5,5-hexafluoro-2,4-pentanedione;

amino acids such as glycine, serine, proline, leucine, alanine, asparagine, aspartic acid, glutamine, histidine, glutamic acid, arginine, cysteine, valine, and lysine; polyprotic and aminopolycarboxylic acids selected from the group consisting of iminodiacetic acid (IDA), malonic acid, oxalic acid, succinic acid, boric acid, nitrilotriacetic acid, malic acid, citric acid, acetic acid, maleic acid, ethylenediaminetetraacetic acid (EDTA), EDTA-2NH$_3$ (ethylenediaminetetraacetic acid diammonium salt), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, and propylenediamine tetraacetic acid; phosphonic acid; phosphonic acid derivatives such as hydroxyethylidene diphosphonic acid (HEDP) (Dequest 2010), 1-hydroxyethane-1,1-diphosphonic acid, nitrilo-tris(methylenephosphonic acid) (NTMP), amino tri(methylene phosphonic acid) (Dequest 2000), diethylenetriamine penta(methylene phosphonic acid) (Dequest 2060S), ethylenediamine tetra(methylene phosphonic acid) (EDTMPA); and combinations thereof. Alternatively, or in addition to, the at least one complexing agent can include an anionic surfactant including, but not limited to, sodium alkyl sulfates such as sodium ethylhexyl sulfate (NIAPROOF® 08), ammonium alkyl sulfates, alkyl ($C_{10}$-$C_{18}$) carboxylic acid ammonium salts, sodium sulfosuccinates and esters thereof, e.g., dioctyl sodium sulfosuccinate, alkyl ($C_6$-$C_{18}$) sulfonic acid sodium salts, and the di-anionic sulfonate surfactants. Preferred anionic surfactants include diphenyloxide disulfonates, such as the DOWFAX line of anionic surfactants available from Dow Chemical, including DOWFAX 2A1 (sodium tetrapropyl diphenyloxide disulfonate), DOWFAX 3A2, DOWFAX 8390, and DowFax™C$_6$L (alkyldiphenyloxide disulfonate), as well as RHODACAL DSB available from Rhone-Poulenc, POLY-TERGENT 2A1, POLY-TERGENT 2EP available from Olin, AEROSOL DPOS-45 available from Cytec, CALFAX DBA-40, CALFAX 16L-35 available from Pilot Chemicals, and the like. Diphenyloxide disulfonate surfactants represent a class of highly anionic surface active agents consisting of disulfonated alkyl diphenyl oxide molecules in which the charge arises from two sulfonate groups and provides excellent emulsion stability. Alternatively, or in addition to, the at least one complexing agent can include antiscalant polymers including, but not limited to, polyaminoamide (PAMAM) dendrimers, poly(2-ethyl-2-oxazoline), polyethyleneimine (PEI), a hydroxylated polyethylenimine, a modified polyethylenimine, polyallylamine hydrochloride (PALAM), poly(acrylamide), poly(acrylic acid), poly(diallyldimethylammonium chloride), diallyldimethylammonium chloride, acrylamide, acetoguanamine, poly(acrylamide-co-diallyl-dimethylammonium chloride) (PAMALAM), and combinations thereof. Alternatively, or in addition to, the complexing agents include salts which comprise an ammonium cation or a tetraalkylammonium cation ([NR$_1$R$_2$R$_3$R$_4$]+, where R$_1$, R$_2$, R$_3$ and R$_4$ may be the same as or different from one another and are selected from the group consisting of hydrogen and $C_1$-$C_6$ alkyl (e.g., methyl, ethyl, propyl, butyl, pentyl, hexyl)), and an anion selected from the group consisting of acetate, chloride, bromide, iodide, sulfate, benzoate, propionate, citrate, formate, oxalate, tartarate, succinate, lactate, maleate, malonate, fumarate, malate, ascorbate, mandelate, and phthalate. For example, the salts can include ammonium bromide and/or ammonium chloride. In one embodiment, the complexing agent comprises at least one of alkyldiphenyloxide disulfonate, 2,4-pentanedione, serine, and any combination thereof.

In another embodiment, any of the compositions of the invention may further comprise titanium nitride and/or photoresist etch material residue, wherein the residue is suspended and/or dissolved in the aqueous composition.

In one embodiment, the composition of the first aspect comprises, consists of, or consists essentially of at least one oxidizing agent, at least one fluoride containing etchant, at least one pH adjustor, at least one metal corrosion inhibitor, and optionally at least one water-miscible solvent, wherein components a through f (when present) are present in the following proportions:
  a. 50 to (balance of materials) weight percent (water);
  b. 0.001 to 5 weight percent (oxidizing agent);
  c. 0.001 to 5 weight percent (fluoride etchant);
  d. 0.001 to 5 weight percent (metal corrosion inhibitor);
  e. 0.1 to 10 weight percent (pH adjustor); and optionally
  f. 1 to 30 weight percent (water-miscible solvent).

In another aspect, the invention provides a composition comprising:
  a. water;
  b. at least one oxidizing agent chosen from periodic acid; hydrogen peroxide, hydrogen peroxide-urea, ammonium persulfate, peracetic acid, t-butyl hydroperoxide, and potassium permanganate;
  c. at least one etchant chosen from HF, tetrafluoroboric acid, hexafluorosilicic acid, $H_2ZrF_6$, $H_2TiF_6$, $HPF_6$, ammonium fluoride, tetramethylammonium fluoride, tetramethylammonium hydroxide, ammonium hexafluorosilicate, and ammonium hexafluorotitanate;
  d. at least one metal corrosion inhibitor chosen from benzyl dimethyl octyl ammonium chloride, benzyl dimethyl dodecyl ammonium chloride, benzyldimethyltetradecyl ammonium chloride, benzyldimethyloctadecyl ammonium chloride, 4-(3-phenylpropyl)pyridine, 4-(3-phenylpropyl)pyridine n-oxide, 3-benzylpyridine N-oxide, benzotriazole, 5-methyl benzotriazole, tolyltriazole, 1,2,4 triazole, and combination of thereof;
  e. at least one pH adjustor chosen from methanesulfonic acid, sulfuric acid, hydrochloric acid, nitric acid, acetic acid, and phosphoric acid; and optionally
  f. at least one water-miscible solvent.

Certain compositions useful for the etching or removal of titanium nitride utilize passivating agents, which serve to reduce the chemical attack on low-k dielectric layers and to protect the wafer from additional oxidation. (See, for example, U.S. Pat. No. 10,138,117, incorporated herein by reference.) In such compositions, low-k passivating agents such as boric acid, borate salts, alkoxysilanes, sodium silicate, tetramethyl ammonium silicate, 3-hydroxy-2-naphthoic acid, malonic acid, and iminodiacetic acid. We have found that the compositions of the present invention do not require such passivating agents in order to be efficacious in selectively removing titanium nitride. Accordingly, in another embodiment, the compositions of the invention do not contain low-k passivating agents.

It will be appreciated that it is common practice to make concentrated forms of the composition to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a further aspect, the invention provides a kit comprising, in one or more containers, one or more components adapted to form the compositions described herein. The containers of the kit must be suitable for storing and shipping said removal composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, can be used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (i.e., additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008, each of which is incorporated herein by reference.

In a further aspect, the invention provides methods of etching titanium nitride material from the surface of a microelectronic device having same thereon using a composition described herein. For example, titanium nitride material may be removed without substantially damaging/removing metal conductor and insulator materials that are present on the microelectronic device. Accordingly, in a further embodiment, a method of selectively and substantially removing titanium nitride relative to molybdenum, oxides of aluminum, silicon dioxide, polysilicon from the surface of the microelectronic device having same thereon is described using a composition described herein. In another embodiment, a method of selectively and substantially removing titanium nitride relative to metal conductor (e.g., copper), tungsten and insulator materials from the surface of the microelectronic device having same thereon is described using a composition described herein.

In etching applications, the composition is applied in any suitable manner to the surface of the microelectronic device having the titanium nitride and/or photoresist etch residue material thereon, e.g., by spraying the composition on the surface of the device, by dipping (in a static or dynamic volume of the composition) of the device including the titanium nitride, by contacting the device with another material, e.g., a pad, or fibrous sorbent applicator element, that has the composition absorbed thereon, by contacting the device including the titanium nitride and/or photoresist etch residue material with a circulating composition, or by any other suitable means, manner or technique, by which the composition is brought into removal contact with the titanium nitride film. The application may be in a batch or single wafer apparatus, for dynamic or static cleaning. Advantageously, the compositions described herein, by virtue of their selectivity for titanium nitride films relative to other materials that may be present on the microelectronic device structure and exposed to the composition, such as metals and insulating materials (i.e., low-k dielectrics), as well as high-k materials such as hafnium oxide, zirconium oxide, titanium oxide, achieve at least partial removal of the titanium nitride in a highly efficient and highly selective manner.

In the use of the compositions described herein for removing titanium nitride from microelectronic device structures having same thereon, the composition typically is contacted with the device structure in a single wafer tool for a sufficient time of from about 0.3 minute to about 30 minutes, or about 0.5 minutes to about 3 minutes, at temperature in a range of from about 20° C. to about 100° C., or about 30° C. to about 60° C. Such contacting times and temperatures are illustrative, and any other suitable time and temperature conditions may be employed that are efficacious to at least partially remove the titanium nitride film from the device structure.

Following the achievement of the desired etching/removal action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.). Accordingly, in a further aspect, the invention provides a method for selectively etching titanium nitride in the presence of molybdenum on a microelectronic device, which comprises exposing said microelectronic device to a composition of the invention, at a temperature of about 20° C. to about 70° C., for a period of about 30 seconds, to about 10 minutes, followed by washing said microelectronic device with deionized water.

In a further aspect, the invention provides improved microelectronic devices made according to the methods described herein and to products containing such microelectronic devices.

In a further aspect, the invention provides methods of manufacturing an article comprising a microelectronic device, said method comprising contacting the microelectronic device with a composition for sufficient time to etchingly remove titanium nitride from the surface of the microelectronic device having same thereon, and incorporating said microelectronic device into said article, wherein the composition comprises, consists of or consists essentially of at least one oxidizing agent, at least one etchant, at least one corrosion inhibitor, optionally at least one complexing agent, and optionally at least one water-miscible solvent.

Certain particular microelectronic devices which involve gate etching in 3D N and Flash memory structures involve a first step of making a molybdenum recess with a high selectivity etchant through a dry etch process as described above. In a second step, the methods and compositions of the invention are implemented to selectively etch titanium.

Accordingly, in a further aspect, the invention provides a method for selectively etching molybdenum and titanium nitride in sequential steps, which comprises:
a. etching molybdenum using a dry etching method, followed by
b. selectively etching titanium nitride in the presence of molybdenum on a microelectronic device, which comprises exposing said microelectronic device to a composition according to the invention, at a temperature of about 20° C. to about 70° C., for a period of about 30 seconds, to about 10 minutes, followed by washing said microelectronic device with deionized water.

In a further aspect, the invention provides an article of manufacture comprising, consisting of or consisting essentially of a microelectronic device substrate, a titanium nitride layer on said substrate, and a composition described herein. In one embodiment, the invention provides a composition consisting or consisting essentially of the components a. through f. recited above.

This invention can be further illustrated by the following examples of preferred embodiments thereof, although it will be understood that these examples are included merely for purposes of illustration and are not intended to limit the scope of the invention unless otherwise specifically indicated.

EXAMPLES

Legend:
MSA: methanesulfonic acid
12C: Benzyldimethyldodecylammonium chloride
14C: Benzyldimethyltetradecylammonium chloride
PPP: 4-(3-phenylpropyl)pyridine
DIW: deionized water
5m-BTA: 5-methyl benzotriazole
RPM—refers to revolutions per minute for the magnetic stir bar used in the experiments
1. Oxidant test (periodic acid)
1) Formulation and test conditions

|     | Formulation |               |     |        |           | Process conditions |       |                   |
|-----|-------------|---------------|-----|--------|-----------|--------------------|-------|-------------------|
| No. | DIW         | Periodic acid | MSA | HF 50% | 12 C (0.2%) | Time             | Temp. | RPM (stirring rod) |
| 1   | Balance     | 0             | 0.5 | 0.02   | 2         | 10 min.            | 30° C.| 360               |
| 2   | Balance     | 0.02          | 0.5 | 0.02   | 2         |                    |       |                   |
| 3   | Balance     | 0.05          | 0.5 | 0.02   | 2         |                    |       |                   |
| 4   | Balance     | 0.1           | 0.5 | 0.02   | 2         |                    |       |                   |
| 5   | Balance     | 0.2           | 0.5 | 0.02   | 2         |                    |       |                   |

2) Etch Result:

| No. | Mo | TiN | AlOx | TEOS | Poly Si | TiN/Mo Selectivity |
|---|---|---|---|---|---|---|
| 1 | 0.77 | 0.32 | 0.65 | 0.65 | 0.21 | 0.42 |
| 2 | 0.67 | 2.36 | 0.71 | 0.61 | 0.10 | 3.52 |
| 3 | 8.51 | 2.66 | 0.77 | 0.61 | 0.19 | 0.31 |
| 4 | 12.83 | 1.54 | 0.56 | 0.60 | 0.33 | 0.12 |
| 5 | 16.68 | 0.47 | 0.53 | 0.54 | 0.50 | 0.03 |

In these experiments, we note the higher periodic acid concentration, the higher the Mo etch rate. Also, the higher periodic acid concentration was, the lower TiN etch rate. Thus, in order to increase the TiN/Mo selectivity, periodic acid concentration is advantageously reduced. If formulations don't have periodic acid, TiN etch rate is very low.

2. Additional oxidant test (Periodic acid and hydrogen peroxide comparison)

1) Formulation and Test Conditions Formulation Process condition

| | Formulation | | | | | Process condition | | |
|---|---|---|---|---|---|---|---|---|
| No. | DIW | Periodic acid | $H_2O_2$ 30% | MSA | HF 50% | 12C 0.2% | Time | Temp | RPM |
| 1 | Balance | 0.01 | | 1 | 0.08 | 10 | 5 min | 45° C. | 360 |
| 2 | Balance | | 0.033 | 1 | 0.08 | 10 | | | |
| 3 | Balance | | 1 | 1 | 0.08 | 10 | | | |
| 4 | Balance | | 5 | 1 | 0.08 | 10 | | | |
| 5 | Balance | | 10 | 1 | 0.08 | 10 | | | |

2) Etch Rate Results

| | Etch rate (Å/min) | | | | | TiN/Mo |
|---|---|---|---|---|---|---|
| No. | Mo | TiN | AlOx | TEOS | Poly Si | selectivity |
| 1 | 2.98 | 34.21 | 0.82 | 1.12 | 1.36 | 11.48 |
| 2 | 1.41 | 6.52 | 0.70 | 1.10 | 1.24 | 4.62 |
| 3 | 9.20 | 10.82 | 0.77 | 1.14 | 0.19 | 1.17 |
| 4 | >30 | 19.83 | 0.56 | 1.21 | 0.33 | <0.66 |
| 5 | >30 | 24.18 | 0.53 | 1.15 | 0.50 | <0.81 |

It is observed that when using hydrogen peroxide as oxidant, Mo etch rate is steeply increased by concentration.

3. HF split test (etchant)

1) Formulation and Test Conditions

| | Formulation | | | | | Process condition | | |
|---|---|---|---|---|---|---|---|---|
| No. | DIW | Periodic acid | MSA | HF50% | 12C 0.2% | Time | Temp | RPM |
| 1 | Balance | 0.02 | 0.5 | 0 | 2 | 10 min | Room Temp. | 360 |
| 2 | Balance | 0.02 | 0.5 | 0.02 | 2 | | | |
| 3 | Balance | 0.02 | 0.5 | 0.04 | 2 | | | |
| 4 | Balance | 0.02 | 0.5 | 0.05 | 2 | | | |
| 5 | Balance | 0.02 | 0.5 | 0.1 | 2 | | | |

2) Test Results:

| | Etch rate (Å/min) | | | | | TiN/Mo |
|---|---|---|---|---|---|---|
| No. | Mo | TiN | AlOx | TEOS | Poly Si | selectivity |
| 1 | 0.46 | 0.12 | 0.54 | 0.04 | 0.15 | 0.26 |
| 2 | 0.60 | 1.59 | 0.71 | 0.61 | 0.1 | 2.65 |
| 3 | 0.82 | 3.41 | 0.82 | 1.01 | 0.41 | 4.16 |
| 5 | 0.89 | 4.62 | 0.69 | 1.03 | 0.32 | 5.19 |
| 5 | 1.37 | 7.33 | 0.57 | 1.34 | 0.22 | 5.35 |

In these experiments, we note that the higher the concentration of HF, the higher the TiN and Mo etch rate. With higher HF concentration, the TEOS etch rate also increases, but not to an excessive extent. The formulation without HF has a very low TiN etch rate.

4. 12C concentration split test (Mo inhibitor)

1) Formulation and Test Conditions:

| | Formulation | | | | | Process conditions | | |
|---|---|---|---|---|---|---|---|---|
| No. | DIW | Periodic acid | MSA | HF 50% | 12C 0.2% | Time | Temp | RPM |
| 1 | Balance | 0.02 | 0.5 | 0.02 | — | 10 min | Room Temp. | 360 |
| 2 | Balance | 0.02 | 0.5 | 0.02 | 0.5 | | | |
| 3 | Balance | 0.02 | 0.5 | 0.02 | 1 | | | |
| 4 | Balance | 0.02 | 0.5 | 0.02 | 1.5 | | | |
| 5 | Balance | 0.02 | 0.5 | 0.02 | 2 | | | |

2) Etch Rate Results:

| No. | Etch rate (Å/min) | | | | | TiN/Mo selectivity |
| | Mo | TiN | AlOx | TEOS | Poly Si | |
| --- | --- | --- | --- | --- | --- | --- |
| 1 | >21.11 | 2.34 | 0.61 | 0.61 | 0.21 | 0.11 |
| 2 | 15.83 | 2.01 | 0.54 | 0.59 | 0.32 | 0.13 |
| 3 | 2.84 | 1.84 | 0.71 | 0.54 | 0.47 | 0.65 |
| 4 | 1.73 | 1.81 | 0.45 | 0.69 | 0.22 | 1.05 |
| 5 | 0.60 | 1.59 | 0.71 | 0.61 | 0.1 | 2.65 |

In these experiments, we note that 12C ([benzyldimethyl-dodecylammonium chloride) is effective as a Mo inhibitor. Additionally, the higher the concentration of 12C, the lower the molybdenum etch rate. The higher the 12 C concentration, the lower the molybdenum etch rate. The higher the 12C concentration, the lower the titanium nitride etch rate. Finally, the 12C concentration does not appear to affect etch rate for other materials such as AlOx, TEOS, and poly Si.

5. Additional Mo inhibitor test (12C, 14C, 5m-BTA, PPP, glycine)

1) Formulation and Test Condition

| No. | Formulation | | | | | | | | Process condition | | |
| | DIW | Periodic acid | MSA (99%) | HF (49%) | 12C (0.2%) | C14 (0.2%) | PPP | 5m-BTA | glycine | Time | Temp | RPM |
| --- | --- | --- | --- | --- | --- | --- | --- | --- | --- | --- | --- | --- |
| 1 | Balance | 0.02 | 0.5 | 0.1 | 2 | | | | | 10 min | RT | 360 rpm |
| 2 | Balance | 0.02 | 0.5 | 0.1 | 5 | | | | | | | |
| 3 | Balance | 0.02 | 0.5 | 0.1 | 10 | | | | | | | |
| 4 | Balance | 0.02 | 0.5 | 0.1 | | 2 | | | | | | |
| 5 | Balance | 0.02 | 0.5 | 0.1 | | 5 | | | | | | |
| 6 | Balance | 0.02 | 0.5 | 0.06 | 6 | | | | | | 35° C. | |
| 7 | Balance | 0.02 | 0.5 | 0.06 | | | 0.2 | | | | | |
| 8 | Balance | 0.02 | 0.5 | 0.06 | | | | 0.16 | | | | |
| 9 | Balance | 0.02 | 0.5 | 0.06 | | | | | 0.08 | | | |
| 10 | Balance | 0.02 | 0.5 | 0.06 | | | 0.4 | | | | | |
| 11 | Balance | 0.02 | 0.5 | 0.06 | | | 0.6 | | | | | |
| 12 | balance | 0.01 | 1 | 0.08 | | | 0.7 | | | 5 min | 50° C. | |
| 13 | balance | 0.01 | 1 | 0.08 | | | 1.1 | | | | | |
| 14 | balance | 0.01 | 1 | 0.08 | | | 1.5 | | | | | |
| 15 | balance | 0.01 | 1 | 0.08 | | | 0.2 | | | | 45° C. | |
| 16 | balance | 0.01 | 1 | 0.08 | | | 0.7 | | | | | |
| 17 | balance | 0.01 | 1 | 0.08 | | | 0.2 | 0.7 | | | | |

| No. | Etch rate (Å/min) | | | | | TiN/Mo selectivity |
| | Mo | TiN | AlOx | TEOS | Poly Si | |
| --- | --- | --- | --- | --- | --- | --- |
| 1 | 1.37 | 7.33 | 0.57 | 1.34 | 0.22 | 5.35 |
| 2 | 1.01 | 3.6 | 0.81 | 1.32 | 0.19 | 3.56 |
| 3 | 1.16 | 4.14 | 0.76 | 1.29 | 0.45 | 3.57 |
| 4 | 1.72 | 1.61 | 0.64 | 1.19 | 0.61 | 0.94 |
| 5 | 1.72 | 1.4 | 0.6 | 1.26 | 0.16 | 0.91 |
| 6 | 1.88 | 16.96 | 0.78 | 0.92 | 0.34 | 9.02 |
| 7 | 1.77 | 15.61 | 0.56 | 0.87 | 0.57 | 8.84 |
| 8 | 2.28 | 17.12 | 0.81 | 0.94 | 0.43 | 7.51 |
| 9 | 12.33 | 15.89 | 0.62 | 1.01 | 0.57 | 1.29 |
| 10 | 2.26 | 16.30 | 0.66 | 0.83 | 0.22 | 7.99 |
| 11 | 2.26 | 1.59 | 0.78 | 0.90 | 0.38 | 6.23 |
| 12 | 4.50 | 62.40 | 0.82 | 1.31 | 0.55 | 13.87 |
| 13 | 3.90 | 61.11 | 0.67 | 1.35 | 0.71 | 15.67 |
| 14 | 4.10 | 62.70 | 0.51 | 1.26 | 0.34 | 15.29 |
| 15 | 15.76 | 37.80 | 0.77 | 1.30 | 1.22 | 2.40 |
| 16 | 3.50 | 37.82 | 0.88 | 1.21 | 1.03 | 10.81 |
| 17 | 1.78 | 34.58 | 0.58 | 1.36 | 1.11 | 19.43 |

In these experiments, we note that 12C exhibits higher TiN/Mo selectivity than 14C (Benzyldimethyltetradecylammonium chloride). Additionally, when 12O concentration is increased, both Mo and TiN etch rate is decreased. Each of 12C, PPP (4-(3-phenylpropyl)pyridine), and 5m-BTA (5methyl-benzotriazole) work as Mo inhibitors, which help to increase TiN/Mo selectivity. Finally, inhibitors combination formulation can help to decrease Mo etch rate. When comparing compositions 15-17, 17 has the lowest Mo etch rate, which result in highest TiN/Mo selectivity.

6. pH adjustor test
1) Formulation and Test Condition

| | | Formulation | | | | | Process Condition | | |
|---|---|---|---|---|---|---|---|---|---|
| No. | DIW | Periodic acid | MSA 99% | HF 49% | 12C 0.2% | 5m-BTA | Time | Temp | RPM |
| 1 | balance | 0.02 | 0.5 | 0.04 | 6 | | 10 min | 35° C. | 360 |
| 2 | balance | 0.02 | 1 | 0.04 | 6 | | | | |
| 3 | balance | 0.02 | 4 | 0.04 | 6 | | | | |
| 4 | balance | 0.005 | 1 | 0.08 | | 0.7 | 3 min | 50° C. | |
| 5 | balance | 0.005 | 0 | 0.0 | | 0.7 | | | |

2) Etch Rate Results:

| | Etch rate (Å/min) | | | | | TiN/Mo |
|---|---|---|---|---|---|---|
| No. | Mo | TiN | AlOx | TEOS | Poly Si | selectivity |
| 1 | 1.32 | 9.23 | 0.61 | 0.68 | 0.21 | 6.99 |
| 2 | 0.86 | 8.48 | 0.54 | 0.61 | 0.32 | 9.86 |
| 3 | 1.23 | 7.62 | 0.61 | 0.70 | 0.47 | 6.20 |
| 4 | 13.87 | 57.80 | 0.85 | 1.33 | 0.49 | 4.17 |
| 5 | 4.97 | 48.83 | 1.02 | 3.01 | 0.72 | 9.82 |

Observations:
(1) w/pH adjustor formulations have similar TiN/Mo selectivity.
(2) w/o pH adjustor formulation have lower Mo etch rate, which results in higher TiN/Mo selectivity. But it has demerit to show higher TEOS Mo etch rate.

7. Solvent Test
1) Formulation and Test Conditions:

| | | Formulation | | | | Process condition | | |
|---|---|---|---|---|---|---|---|---|
| No. | DIW | Periodic acid | Ethylene glycol | HF 49% | 5m-BTA | Time | Temp | RPM |
| 1 | balance | 0.005 | | 0.04 | 0.7 | 5 min | 50° C. | 360 |
| 2 | 97.44 | 0.005 | 10 | 0.04 | 0.7 | | | |
| 3 | 97.43 | 0.005 | 15 | 0.04 | 0.7 | | | |

2) Etch Rate Results:

| | Etch rate (Å/min) | | | | | TiN/Mo |
|---|---|---|---|---|---|---|
| No. | Mo | TiN | AlOx | TEOS | Poly Si | selectivity |
| 1 | 6.90 | 53.70 | 0.71 | 1.06 | 0.97 | 7.78 |
| 2 | 10.90 | 47.40 | 0.87 | 1.13 | 1.22 | 4.35 |
| 3 | 13.40 | 39.40 | 0.68 | 1.11 | 0.88 | 2.94 |

(1) Ethylene glycol help to dissolve 5m-BTA in formulation.
(2) but w/EG formulations have lower TiN/Mo selectivity.

The invention has been described in detail with particular reference to certain embodiments thereof, but it will be understood that variations and modifications can be affected within the spirit and scope of the invention.

The invention claimed is:
1. A composition comprising:
  a. water;
  b. at least one oxidizing agent;
  c. at least one fluoride containing etchant;
  d. 4-(3-phenylpropyl)pyridine and 5-methyl benzotriazole;
  e. at least one pH adjustor selected from the group consisting of methane sulfonic acid, ethane sulfonic acid, phosphoric acid, sulfuric acid, and hydrogen chloride; and
  optionally
  f. at least one water-miscible solvent.
2. The composition of claim 1, wherein the at least one oxidizing agent comprises periodic acid.
3. The composition of claim 1, wherein the pH of the composition is about −1 to 5.
4. The composition of claim 1, wherein the pH of the composition is about 0 to 4.
5. The composition of claim 1, wherein the composition comprises a water-miscible solvent chosen from ethylene glycol and propylene glycol.

* * * * *